United States Patent
Choi et al.

(10) Patent No.: US 9,966,934 B2
(45) Date of Patent: May 8, 2018

(54) DUTY CORRECTION DEVICE AND SEMICONDUCTOR DEVICE INCLUDING THE SAME

(71) Applicant: SK hynix Inc., Icheon-si Gyeonggi-do (KR)

(72) Inventors: Geun Ho Choi, Icheon-si (KR); Dong Kyun Kim, Cheongju-si (KR); Min Su Park, Seoul (KR); Dong Uk Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/359,757

(22) Filed: Nov. 23, 2016

(65) Prior Publication Data

US 2018/0069532 A1    Mar. 8, 2018

(30) Foreign Application Priority Data

Sep. 5, 2016 (KR) ........................ 10-2016-0113925

(51) Int. Cl.
  *H03K 3/01* (2006.01)
  *H03K 3/017* (2006.01)
  *H03K 17/687* (2006.01)

(52) U.S. Cl.
  CPC ......... *H03K 3/017* (2013.01); *H03K 17/6872* (2013.01)

(58) Field of Classification Search
  CPC ........ H03K 21/10; H03K 3/011; H03K 3/015; H03K 3/017; H03K 5/1252; H03K 7/08
  USPC ................................ 327/172, 173, 174, 175
  See application file for complete search history.

(56) References Cited

U.S. PATENT DOCUMENTS

| 7,180,346 | B2 * | 2/2007 | Lee ...................... H03K 5/1565 327/172 |
| 7,821,310 | B2 | 10/2010 | Yun et al. |
| 8,542,045 | B2 | 9/2013 | Na et al. |

\* cited by examiner

*Primary Examiner* — John Poos
(74) *Attorney, Agent, or Firm* — William Park & Associates Ltd.

(57) ABSTRACT

A duty correction device may be provided. The duty correction device may include a duty controller configured to output a control signal by controlling a duty of a duty corrected signal, and detect a level of a feedback signal to convert the duty based on a code signal which is applied at a section where the level of the feedback signal corresponds to a logic level. The duty correction device may include a power gating circuit configured to generate the feedback signal by driving the control signal.

20 Claims, 8 Drawing Sheets

DUTY CORRECTION DEVICE AND SEMICONDUCTOR DEVICE INCLUDING THE SAME

CROSS-REFERENCES TO RELATED APPLICATION

The present application claims priority under 35 U.S.C. § 119(a) to Korean application number 10-2016-0113925, filed on Sep. 5, 2016, in the Korean Intellectual Property Office, which is incorporated herein by reference in its entirety.

BACKGROUND

1. Technical Field

Various embodiments may generally relate to a duty correction device, and more particularly, a duty correction device related to correcting the duty of a clock.

2. Related Art

In semiconductor devices such as synchronous memory devices, which operate based on a clock, it is very important to accurately control the duty of the clock. When the duty of a clock is 50%, it may indicate that a high-level period of the clock signal has the same amplitude as a low-level period of the clock signal.

In the case of a synchronous memory device, data must be inputted and outputted (inputted/outputted) in synchronization with rising and falling edges of a clock. When the duty of the clock is not exactly 50% in such a semiconductor memory device, the timings between the rising and falling edges may be distorted. In this case, the data may not inputted/outputted at accurate timings. Thus, the synchronous memory device uses a DCC (Duty Correction Circuit) in order to exactly adjust the duty of the clock to 50%.

SUMMARY

In an embodiment of the present disclosure, a duty correction device may be provided. The duty correction device may include a duty controller configured to output a control signal by controlling a duty of a duty corrected signal, and detect a level of a feedback signal to convert the duty based on a code signal which is applied at a section where the level of the feedback signal corresponds to a logic level. The duty correction device may include a power gating circuit configured to generate the feedback signal by driving the control signal.

In an embodiment of the present disclosure, a semiconductor device may be provided. The semiconductor device may include a duty correction device configured to correct a duty of a duty corrected signal and output the corrected signal as a control signal, when a normal path is selected according to a select signal, and drive the control signal to correct a duty of a feedback signal based on a code signal when a feedback loop path is selected according to the select signal. The semiconductor device may include an output driver configured to drive an output signal of the duty correction device and output the driven signal to an output terminal.

DETAILED DESCRIPTION

Hereinafter, a duty correction device and a semiconductor device including the same according to the present disclosure will be described below with reference to the accompanying drawings through examples of embodiments.

Various embodiments may be directed to a duty correction device capable of improving duty correction efficiency without a duty detector.

Figure 1:
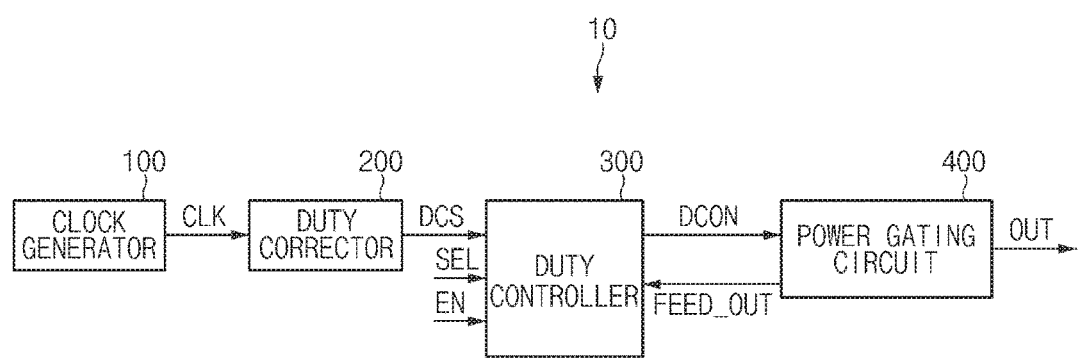
FIG. 1 is a configuration diagram illustrating a representation of an example of a duty correction device according to an embodiment.

FIG. 1 is a configuration diagram illustrating a representation of an example of a duty correction device according to an embodiment.

The duty correction device 10 according to a present embodiment includes a clock generator 100, a duty corrector 200, a duty controller 300 and a power gating circuit 400.

The clock generator 100 generates a clock signal CLK and provides the generated clock signal CLK to the duty corrector 200. The duty corrector 200 generates a duty corrected signal DCS by correcting the duty of the clock signal CLK. The duty corrector 200 may include a DCC (Duty Correction Circuit) for correcting the duty of the clock signal CLK.

The duty controller 300 controls the duty of the duty corrected signal DCS and generates a control signal DCON, in response to a select signal SEL, an enable signal EN and a feedback signal FEED_OUT.

The power gating circuit 400 provides an output signal OUT for controlling power of an internal circuit in response to the control signal DCON. The power gating circuit 400 drives the control signal DCON to feed back a feedback signal FEED_OUT to the duty controller 300.

A semiconductor integrated circuit may include a circuit which partially controls the power of internal circuits in order to reduce power consumption, that is, the power gating circuit 400. The power gating circuit 400 can reduce dynamic and static power consumption by blocking power supply to a block which is not operated in the system.

Although the duty of the clock signal CLK generated through the clock generator 100 was corrected through the duty corrector 200, the duty may be distorted by a pull-up/pull-down ratio of a repeater or driving circuit while the clock signal CLK is passed through the repeater and driving circuit including an inverter chain and the like. That is, when the duty is distorted in the power gating circuit 400, the duty cannot be corrected.

In order to solve such a problem, the duty correction device may include a duty detector which receives an output signal and detects the duty of the output signal. Since the duty detector samples a feedback signal or is charged through a capacitor, a circuit for implementing the duty detector may occupy a large area.

Thus, the duty correction device according to a present embodiment may form a feedback loop through the duty controller 300 while a separate duty detector is not used, thereby more finely correcting the duty of the power gating circuit 400 through a simple circuit configuration.

Figure 2:
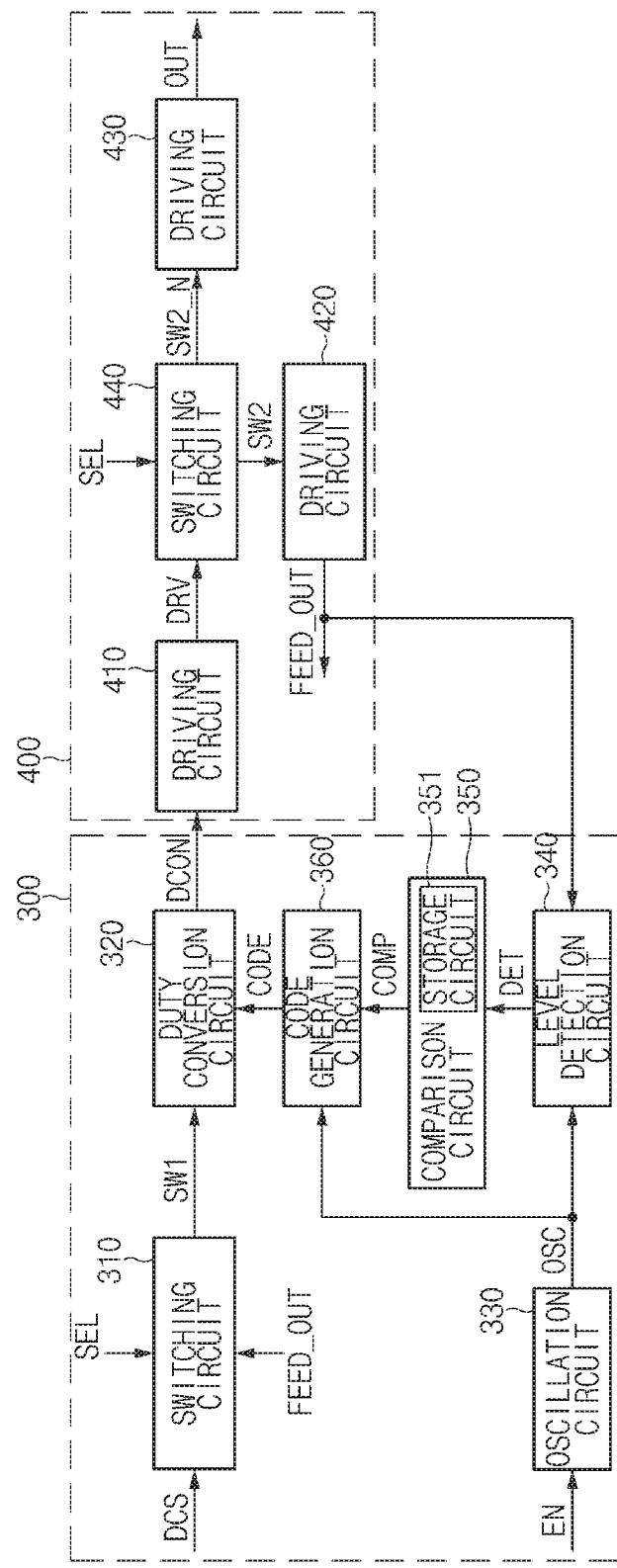
FIG. 2 is a configuration diagram illustrating a representation of an example of a duty controller and a power gating circuit of FIG. 1.

FIG. 2 is a circuit diagram illustrating a representation of an example of the duty controller 300 and the power gating circuit 400 of FIG. 1.

The duty controller 300 includes a switching circuit 310, a duty conversion circuit 320, an oscillation circuit 330, a level detection circuit 340, a comparison circuit 350 and a code generation circuit 360. The power gating circuit 400 includes driving circuits 410 to 430 and a switching circuit 440.

The switching circuit 310 selects any one of a normal path and a feedback loop path in response to a select signal SEL. That is, the switching circuit 310 selects any one of the duty corrected signal DCS and the feedback signal FEED_OUT in response to the select signal SEL, and outputs the selected signal as a switching signal SW1.

For example, when the select signal SEL is at a logic high level, the switching circuit 310 selects the duty corrected signal DCS and outputs the selected signal as the switching signal SW1. On the other hand, when the select signal SEL is at a logic low level, the switching circuit 310 selects the feedback signal FEED_OUT and outputs the selected signal as the switching signal SW1.

The duty conversion circuit 320 converts the duty of the switching signal SW1 in response to a code signal CODE, and outputs the control signal DCON. The oscillation circuit 330 generates the oscillation signal OSC having a predetermined cycle, when the enable signal EN is activated. The oscillation signal OSC generated by the oscillation circuit 330 is outputted to the level detection circuit 340 and the code generation circuit 360.

The level detection circuit 340 detects the logic level of the feedback signal FEED_OUT in response to the oscillation signal OSC, and outputs a detection signal DET. The level detection circuit 340 may include a flip-flop circuit which flip-flops the feedback signal FEED_OUT in synchronization with the oscillation signal OSC, and outputs the flip-flopped signal as the detection signal DET.

The comparison circuit 350 detects a change in logic level of the detection signal DET, and outputs a comparison signal COMP. The comparison circuit 350 compares the logic level of the previously inputted detection signal DET to the logic level of the currently inputted detection signal DET. The comparison circuit 350 may include a storage circuit 351 for storing the previously inputted detection signal DET.

For example, the comparison circuit 350 stores the logic level of a detection signal DET in the storage circuit 351, the detection signal DET being inputted at a first timing. Then, when a detection signal DET is inputted at a second timing, the comparison circuit 350 compares the logic level of the detection signal DET to the first logic level stored in the storage circuit 351, and outputs the comparison result as the comparison signal COMP.

When the logic level of the detection signal DET is not changed, the comparison circuit 350 retains the comparison signal COMP at a first logic level. The comparison circuit 350 changes the comparison signal COMP to a second logic level at a timing that the logic level of the detection signal DET is changed.

The code generation circuit 360 generates a code signal CODE for adjusting a duty value in response to the oscillation signal OSC and the comparison signal COMP. The code generation circuit 360 may generate the code signal CODE in synchronization with an activation timing of the oscillation signal OSC, and fix the code signal CODE in response to the comparison signal COMP.

The driving circuit 410 drives the control signal DCON to output a driving signal DRV. The driving circuit 420 drives a switching signal SW2 to output the feedback signal FEED_OUT. The driving circuit 430 drives a switching signal SW2_N to output an output signal OUT.

All of the driving circuits 410 to 430 may be designed to the same size, such that the duty is distorted by the same amount. The driving circuits 410 and 430 may have a size corresponding to a half size of an existing driving circuit.

For example, suppose that the existing driving circuit has an inverter chain structure including four inverters. Then, the driving circuit 410 may have an inverter chain structure including two inverters, and the driving circuit 430 may have an inverter chain structure including two inverters.

In a present embodiment, the configuration in which the existing driving circuit is divided into two driving circuits has been exemplified. However, the present embodiments are not limited thereto, but the number of divided driving circuits can be changed.

The driving circuit 420 forming the feedback loop may be implemented with a replica circuit of the driving circuit 410. For example, when the driving circuit 410 has an inverter chain structure including two inverters, the driving circuit 420 may also have an inverter chain structure including two inverters.

The switching circuit 440 selects any one of the normal path and the feedback loop path in response to the select signal SEL. That is, the switching circuit 440 outputs the driving signal DRV as the switching signal SW2_N or the switching signal SW2 in response to the select signal SEL.

For example, when the select signal SEL is at a logic high level, the switching circuit 440 selects the switching signal SW2_N and outputs the driving signal DRV as the switching signal SW2_N. On the other hand, when the select signal SEL is at a logic low level, the switching circuit 440 selects the switching signal SW2 and outputs the driving signal DRV as the switching signal SW2.

The active state of the select signal SEL for controlling the switching circuits 310 and 440 may be controlled by a command signal which is inputted during duty correction. For example, the select signal SEL may be generated by a ZQ calibration command, generated by a command signal for performing a training operation, and generated by a command signal applied from a controller.

In a present embodiment, "feedback loop" may indicates a path through which a signal having passed through the switching circuit 310 is passed through the duty conversion circuit 320, the driving circuit 410, the switching circuit 440, the driving circuit 420, the level detection circuit 340, the comparison circuit 350 and the code generation circuit 360 and then inputted to the duty conversion circuit 320.

The duty controller 300 and the power gating circuit 400, which have an above-described configuration, may convert a duty without passing through the feedback loop, when the switching circuits 310 and 440 select the normal path in response to the select signal SEL. The duty correction device according to a present embodiment can correct a duty through the feedback loop, without a separate duty detector.

That is, when the select signal SEL is at a logic high level, the duty corrected signal DSC inputted to the switching circuit 310 is outputted after being passed through the switching circuit 310, the duty conversion circuit 320, the driving circuit 410, the switching circuit 440 and the driving circuit 430. On the other hand, when the select signal SEL is at a logic low level, the duty corrected signal DSC inputted to the switching circuit 310 is outputted as the feedback signal FEED_OUT after being passed through the switching circuit 310, the duty conversion circuit 320, the driving circuit 410, the switching circuit 440 and the driving circuit 420. The feedback signal FEED_OUT is transferred to the duty conversion circuit 320 through the level detection circuit 340, the comparison circuit 350 and the code generation circuit 360, thereby forming the feedback loop.

Figure 3:
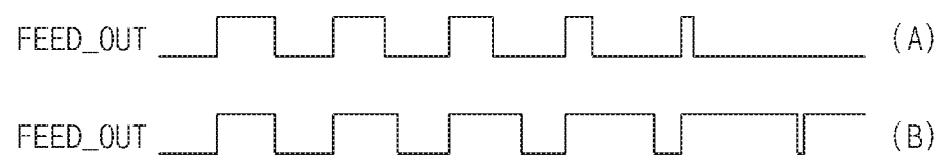
FIGS. 3 and 4 are diagrams for describing an operation of a level detection circuit of FIG. 2.
Figure 4:
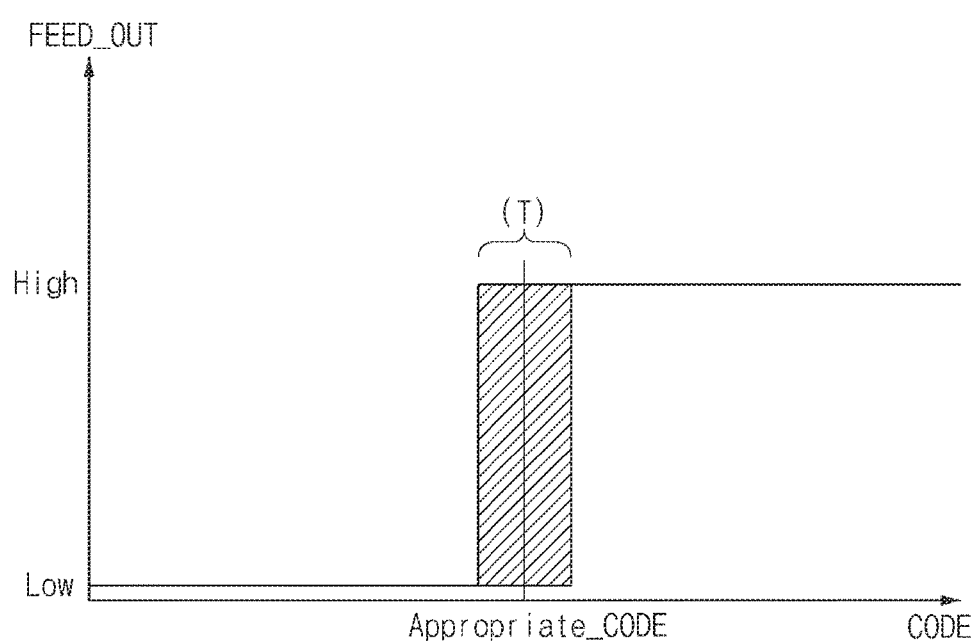

FIGS. 3 and 4 are diagrams for describing the operation of the level detection circuit 340 of FIG. 2.

The level detection circuit 340 detects the logic level of the feedback signal FEED_OUT in response to the oscillation signal OSC, and outputs the detection signal DET.

The feedback signal FEED_OUT is stabilized to any one level while being controlled through the feedback loop. That is, while the control signal outputted from the duty conversion circuit 320 is passed through the driving circuits 410 and 420, a duty difference my occur, the duty difference corresponding to how much the pull-up and pull-down (pull-up/pull-down) ratio of the inverter chains is distorted.

Thus, the feedback signal FEED_OUT inputted to the level detection circuit 340 has a duty width that gradually decreases as indicated by (A) of FIG. 3. That is, as the high pulse width of the feedback signal FEED_OUT gradually decreases with time, the feedback signal FEED_OUT is fixed to a low level after a predetermined time.

On the other hand, the feedback signal FEED_OUT inputted to the level detection circuit 340 has a duty width that gradually increases as indicated by (B) of FIG. 3. That is, as the high pulse width of the feedback signal FEED_OUT gradually increases with time, the feedback signal FEED_OUT is fixed to a high level after a predetermined time.

The duty conversion circuit 320 converts the duty according to the code signal CODE and outputs the control signal DCON, and the feedback signal FEED_OUT is changed in response to the control signal DCON. However, when the correction amount of the duty conversion circuit 320 coincides with the value of the duty distorted through the driving circuits 410 and 420, the feedback signal FEED_OUT is continuously circulated through the feedback loop.

Thus, the duty controller 300 detects a point of time that the feedback signal FEED_OUT is stabilized, while continuously changing the code signal CODE. The level detection circuit 340 detects a point of time that the logic level of the feedback signal FEED_OUT is neither a low level nor a high level as illustrated in FIG. 4, and controls the detection signal DET.

Referring to FIG. 4, T represents a section where a logic signal in an unknown state is outputted. That is, the section T indicates a section where the logic state of the feedback signal FEED_OUT is not clearly defined as a logic high state or logic low state. The code generation circuit 360 fixes the duty ratio in response to the code signal CODE applied at the unknown-state section T.

When the feedback circuit has a short stabilization time, the section T is widened, and when the feedback circuit has a long stabilization time, the section T is narrowed. Thus, the duty controller 300 may set the stabilization time to a desired section by adjusting the timing that the code value of the code signal CODE is detected. The generation time point of the code signal CODE may be controlled by adjusting the pulse timing of the oscillation circuit 330.

For example, suppose that the duty of the inverter chain of the driving circuit 410 is distorted by −10%. Then, since the control signal DCON is passed through the driving circuits 410 and 420 when the normal path is selected, the duty may be distorted by −20% at the final stage. In order to correct the duty of the power gating circuit 400, the duty conversion circuit 320 needs to correct a duty of −20%.

When the feedback loop path is selected, the control signal DCON is passed through the driving circuits 410 and 420. At this time, since the control signal DCON is passed through the two driving circuits 410 and 420, the duty of the feedback signal FEED_OUT is distorted by −20% as in the normal path.

If the duty is not corrected by the duty conversion circuit 320, the duty of the duty corrected signal DCS is distorted by −10% whenever the duty corrected signal DCS is passed through the driving circuits of the power gating circuit 400 while continuously circulating through the feedback loop. Then, the feedback signal FEED_OUT is fixed to a low level.

However, when the duty conversion circuit 320 corrects the duty by +20% according to the change of the code signal CODE, the distortion ratio of the duty becomes zero. When the duty conversion circuit 320 controls the duty by more than +20% while the duty corrected signal DCS is continuously circulated through the feedback loop, the feedback signal FEED_OUT is stabilized to a high level. In this way, the level detection circuit 340 corrects the duty of the duty conversion circuit 320 in response to the code signal CODE of the section where the feedback signal FEED_OUT is changed to a stabilization level.

Figure 5:
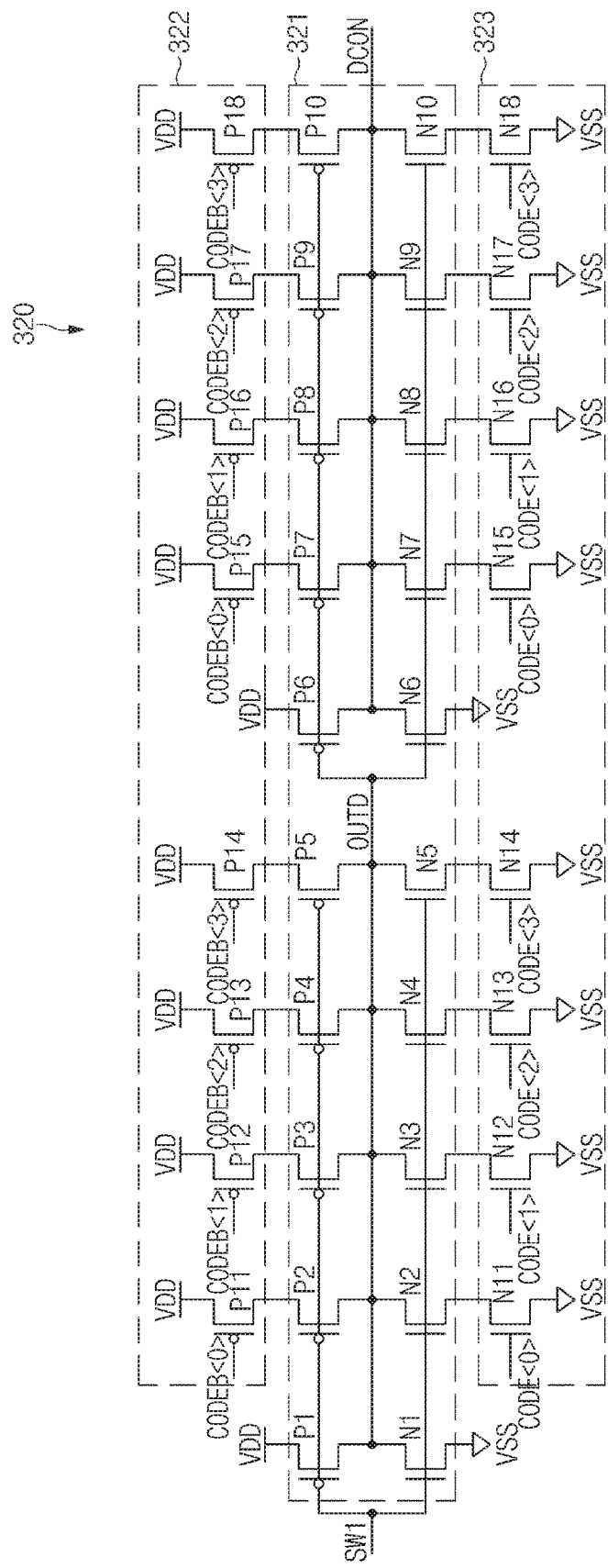
FIG. 5 is a circuit diagram illustrating a representation of an example of a duty conversion circuit of FIG. 2.

FIG. 5 is a circuit diagram illustrating a representation of an example of the duty conversion circuit 320 of FIG. 2.

The duty conversion circuit 320 includes an inverter circuit 321, a pull-up driving circuit 322 and a pull-down driving circuit 323.

The inverter circuit 321 outputs the control signal DCON by driving and delaying the switching signal SW1. The inverter circuit 321 may include a plurality of PMOS transistors P1 to P10 and a plurality of NMOS transistors N1 to N10.

Among the transistors, the plurality of PMOS transistors P1 to P5 and the plurality of NMOS transistors N1 to N5 drive the switching signal SW1 to output a driving signal OUTD. The plurality of PMOS transistors P6 to P10 and the plurality of NMOS transistors N6 to N10 drive the driving signal OUTD to output the control signal DCON.

The plurality of PMOS transistors P1 to P5 have different sizes (for example, channel widths of the transistors). For example, under the supposition that the size of the PMOS transistor P1 has a default value of "2", the PMOS transistors P2 to P5 have increasing values of "4, 8, 16 and 32".

Similarly, the plurality of PMOS transistors P6 to P10 have different sizes. For example, under the supposition that the size of the PMOS transistor P6 has a default value of "2", the plurality of PMOS transistor P7 to P10 have decreasing values of "32, 16, 8 and 4".

Furthermore, the plurality of NMOS transistors N1 to N5 have different sizes. For example, under the supposition that the size of the NMOS transistor N1 has a default value of "1", the NMOS transistors N2 to N5 have decreasing values of "8, 4, 2 and 1".

Similarly, the plurality of NMOS transistors N6 to N10 have different sizes. For example, under the supposition that the size of the NMOS transistor N6 has a default value of "1", the NMOS transistors N7 to N10 have increasing values of "4, 8, 16 and 32".

The pull-up driving circuit 322 includes a plurality of pull-up driving elements P11 to P18. The plurality of pull-up driving elements P11 to P18 are coupled between supply voltage terminals VDD and the inverter circuit 321, and receive code signals CODEB<0:3> through gate terminals thereof. The code signal CODEB has the opposite phase of the phase of the code signal CODE.

The pull-down driving circuit 323 includes a plurality of pull-down driving elements N11 to N18. The plurality of pull-down driving elements N11 to N18 are coupled between the inverter circuit 321 and ground voltage terminals VSS, and receive the code signals CODE<0:3> through gate terminals thereof.

The pull-up driving circuit 322 and the pull-down driving circuit 323 may adjust the number of driving elements which are turned on among the plurality of pull-up driving elements P11 to P18 and the plurality of pull-down driving elements N11 to N18, in response to the code signals CODE<0:3> and the code signals CODEB<0:3>, thereby converting the duty of an input signal.

For example, when the codes signal CODE<0:3> and the code signal CODEB<0:3> are not inputted, the output signal OUT is outputted with a normal waveform because the pull-up/pull-down ratio of the pull-up driving circuit 322 to the pull-down driving circuit 323 is normal.

When the code signal CODE<0> is inputted at a logic high level, the drivability of the pull-up driving circuit 322 is increased because the number of transistors which are turned on in the pull-up driving circuit 322 is larger than the number of transistors which are turned on in the pull-down driving circuit 323. Then, the duty of the output signal OUT increases. On the other hand, when the code signal CODE<3> is inputted at a logic high level, the drivability of the pull-down driving circuit 323 is increased because the number of transistors which are turned on in the pull-down driving circuit 323 is larger than the number of transistors which are turned on in the pull-up driving circuit 322. Then, the duty of the output signal OUT decreases.

In a present embodiment, the number of code signals is set to 4. However, the present embodiments are not limited thereto, but the number of code signals can be changed. The duty conversion circuit 320 illustrated in FIG. 5 is only an example. The duty conversion circuit 320 may include a capacitor for more finely adjusting a duty or controlling a duty adjustment amount, and a circuit for changing the size of a MOS capacitor may be added.

Figure 6:
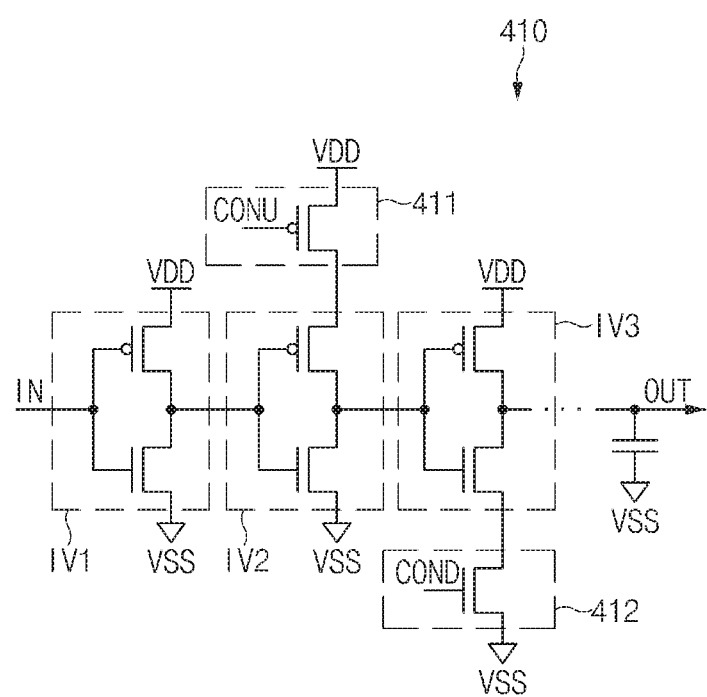
FIG. 6 is a circuit diagram illustrating a representation of an example of a driving circuit of FIG. 2.

FIG. 6 is a circuit diagram illustrating a representation of an example of the driving circuit 410 of FIG. 2. Since the driving circuits 410 to 430 of FIG. 2 have the same configuration, the following descriptions will be focused on the configuration of the driving circuit 410.

The driving circuit 410 includes a plurality of inverters IV1 to IV3 coupled in series as a chain structure between an input terminal IN and an output terminal OUT. The inverter IV1 is set to a default value. The inverter IV2 at the second stage includes a pull-up driving element 411 positioned at a pull-up terminal to which the supply voltage VDD is applied. The inverter IV3 at the third stage includes a pull-down driving element 412 positioned at a pull-down terminal to which the ground voltage VSS is applied. The pull-up driving element 411 may be controlled by a pull-up control signal CONU, and the pull-down driving element 412 may be controlled by a pull-down control signal COND.

That is, the driving circuit 410 has a zigzag pattern in which the pull-up driving element 411 and the pull-down driving element 412 are alternately arranged. The driving circuit 410 having such a zigzag pattern may be controlled by the control signal DCON of which the duty is controlled.

When the driving circuits 410 to 430 have a zigzag pattern, the duty may be more easily distorted than in a general pattern. In a present embodiment, when the power gating circuit 400 includes the driving circuits 410 to 430 each having the structure of FIG. 6, the duty correction device may receive an output of the power gating circuit 400, such that the duty controller 300 can correct the distorted duty.

Figure 7:
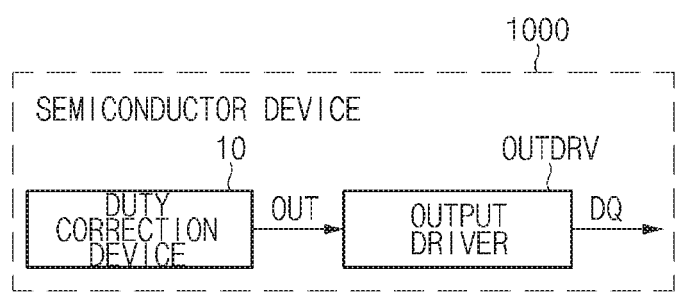
FIG. 7 is a configuration diagram illustrating a representation of an example of a semiconductor device according to an embodiment.

FIG. 7 is a configuration diagram of a semiconductor device 110 according to an embodiment. FIG. 7 illustrates that the duty correction device 10 according to a present embodiment can be applied to a semiconductor device 1000.

The semiconductor device 1000 may include the duty correction device 10 according to the embodiment of FIGS. 1 to 6. An output signal OUT of the duty correction device 10 may be outputted as output data DQ through an output driver OUTDRV. The output driver OUTDRV drives the output signal OUT to output the output data DQ to an output terminal.

Figure 8:
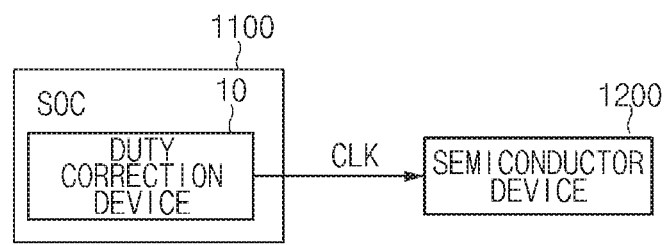
FIG. 8 is a configuration diagram illustrating a representation of an example of a semiconductor device according to an embodiment.

FIG. 8 is a configuration diagram of a system according to an embodiment. FIG. 8 illustrates that the duty correction device 10 according to a present embodiment can be applied to an SOC (System On Chip) 1100.

The SOC 1100 may include the duty correction device 10 according to the embodiments of FIGS. 1 to 6. An output signal OUT (clock signal CLK) of the duty correction device 10 is provided to a semiconductor device 1200. The semiconductor device 1200 controls an operation of an internal circuit in response to the clock signal CLK applied from the SOC 1100.

According to the recent trend, the increase in the number of mobile electronic products has required high power consumption and battery usage with the improvement in performance of the products. The rapid increase of power consumption is suppressed through the SOC technology and power management software technology.

The power consumption is a main factor which has an influence on the cost and reliability of all electronic products using nanoscale semiconductor devices as well as battery-driven devices such as mobile phones. Thus, in order to improve the power consumption, research has been conducted on various fields such as semiconductor devices and systems.

A power gating function may be controlled through a PMU (Power Management Unit) within a system. For circuit blocks constituting an SOC, a sleep transistor between a power rail and a power supply line of a circuit may be turned on to supply power in an active mode, and turned off to block the power supply in a sleep mode.

According to the present embodiments, the duty correction device may improve the duty correction efficiency without a separate duty detector.

While certain embodiments have been described above, it will be understood to those skilled in the art that the embodiments described are by way of example only. Accordingly, the semiconductor devices described herein should not be limited based on the described embodiments. Rather, the semiconductor devices described herein should only be limited in light of the claims that follow when taken in conjunction with the above description and accompanying drawings.

What is claimed is:

1. A duty correction device comprising:
  a duty controller configured to output a control signal by controlling a duty of a duty corrected signal, and detect a level of a feedback signal to convert the duty based on a code signal which is applied at a section where the level of the feedback signal corresponds to a logic level; and a power gating circuit configured to generate the feedback signal by driving the control signal,
wherein the duty controller comprises:
a level detection circuit configured to detect the logic level of the feedback signal based on an oscillation signal, and output a detection signal;
a comparison circuit configured to compare the detection signal and a previously stored signal, and output a comparison signal; and
a code generation circuit configured to generate the code signal based on the oscillation signal, and set the code signal based on the comparison signal.

2. The duty correction device of claim 1, wherein the duty controller further comprises:
a duty conversion circuit configured to correct the duty of the duty corrected signal and output the corrected signal as the control signal, or convert the duty of the feedback signal based on the code signal and output the converted signal as the control signal.

3. The duty correction device of claim 1, wherein the duty controller further comprises a first switching circuit configured to select the duty corrected signal according to a select signal and output the selected signal to the duty conversion circuit, or select the feedback signal and output the selected signal to the duty conversion circuit.

4. The duty correction device of claim 1, wherein the duty controller further comprises an oscillation circuit configured to generate the oscillation signal based on an enable signal.

5. The duty correction device of claim 1, wherein the comparison circuit comprises a storage circuit configured to store the detection signal.

6. The duty correction device of claim 1, wherein the duty controller fixes a duty ratio of the duty conversion circuit based on the code signal which is applied at an unknown-state section where the logic level of the feedback signal is not defined as a high state or low state.

7. The duty correction device of claim 1, wherein the power gating circuit comprises:
a first driving circuit configured to drive the control signal to output a driving signal;
a second driving circuit configured to drive the driving signal to output the feedback signal;
a third driving circuit configured to drive the output of the first driving circuit to output an output signal; and
a second switching circuit configured to output the driving signal to the third driving circuit according to a select signal or output the driving signal to the second driving circuit.

8. The duty correction device of claim 7, wherein the first driving circuits, the second driving circuits and the third driving circuits have substantially the same size.

9. The duty correction device of claim 7, wherein the first, second, and third driving circuits have a zigzag pattern.

10. The duty correction device of claim 7, wherein each of the first and second driving circuits comprises:
a plurality of inverters coupled in series as a chain structure between an input terminal and an output terminal;
a pull-up driving element coupled to a part of terminals of the plurality of inverters, and configured to selectively supply a supply voltage based on a pull-up control signal; and
a pull-down driving element coupled to the other part of the terminals of the plurality of inverters, and configured to selectively supply a ground voltage based on a pull-down control signal.

11. The duty correction device of claim 10, wherein the pull-up driving element and the pull-down driving element are alternately arranged to provide a zigzag pattern.

12. The duty correction device of claim 1, further comprising:
a clock generator configured to generate a clock; and
a duty corrector configured to correct the duty of the clock, and output the duty corrected signal.

13. A semiconductor device comprising:
a duty correction device configured to correct a duty of a duty corrected signal and output the corrected signal as a control signal, when a normal path is selected according to a select signal, and drive the control signal to correct a duty of a feedback signal based on a code signal when a feedback loop path is selected according to the select signal; and
an output driver configured to drive an output signal of the duty correction device and output the driven signal,
wherein the duty correction device comprises a duty controller configured to output the control signal;
wherein the duty controller comprises:
a level detection circuit configured to detect a logic level of the feedback signal based on an oscillation signal, and output a detection signal;
a comparison circuit configured to compare the detection signal and a previously stored signal, and output a comparison signal; and
a code generation circuit configured to generate the code signal based on the oscillation signal, and set the code signal based on the comparison signal.

14. The semiconductor device of claim 13, wherein the duty correction device further comprises:
a power gating circuit configured to generate the feedback signal by driving the control signal.

15. The semiconductor device of claim 13, wherein the duty controller further comprises:
a duty conversion circuit configured to correct the duty of the duty corrected signal and output the corrected signal as the control signal, or convert the duty of the feedback signal based on the code signal and output the converted signal as the control signal; and
a first switching circuit configured to select the duty corrected signal according to the select signal and output the selected signal to the duty conversion circuit, or select the feedback signal and output the selected signal to the duty conversion circuit.

16. The semiconductor device of claim 15,
wherein the power gating circuit comprises:
a first driving circuit configured to drive the control signal to output a driving signal;
a second driving circuit configured to drive the driving signal to output the feedback signal;
a third driving circuit configured to output the output of the first driving circuit to output an output signal,
wherein the duty controller further comprises a first switching circuit configured to select the duty corrected signal according to the select signal and output the selected signal to the duty conversion circuit, or select the feedback signal and output the selected signal to the duty conversion circuit,
wherein the power gating circuit further comprises a second switching circuit configured to output the driving signal to the third driving circuit or output the driving signal to the second driving circuit, according to the select signal, and
wherein a feedback loop path is a path through which a signal having passed through the first switching circuit is passed through the duty conversion circuit, the first driving circuit, the second switching circuit, the second driving circuit, the level detection circuit, the comparison circuit, and the code generation circuit and then inputted to the duty conversion circuit.

17. The semiconductor device of claim 16,
wherein the duty controller comprises a duty conversion circuit configured to correct the duty of the duty corrected signal and output the corrected signal as the control signal, or convert the duty of the feedback signal based on the code signal and output the converted signal as the control signal,
wherein the duty controller comprises a first switching circuit configured to select the duty corrected signal according to the select signal and output the selected signal to the duty conversion circuit, or select the feedback signal and output the selected signal to the duty conversion circuit,
wherein the power gating circuit comprises:
a first driving circuit configured to drive the control signal to output a driving signal;
a second driving circuit configured to drive the driving signal to output the feedback signal;
a third driving circuit configured to output the output of the first driving circuit to output an output signal; and
a second switching circuit configured to output the driving signal to the third driving circuit, and
wherein the normal path is a path through which a the duty corrected signal inputted to the first switching circuit is outputted after being passed through the first switching circuit, the duty conversion circuit, the first driving circuit, the second switching circuit, and the third driving circuit.

18. The semiconductor device of claim 14, wherein the power gating circuit comprises:
a first driving circuit configured to drive the control signal to output a driving signal;
a second driving circuit configured to drive the driving signal to output the feedback signal; and
a third driving circuit configured to output the output of the first driving circuit to output an output signal;
the first to third driving circuits have substantially the same size; and
a second switching circuit configured to output the driving signal to the third driving circuit or output the driving signal to the second driving circuit, according to the select signal.

19. The semiconductor device of claim 18, wherein each of the first to third driving circuits comprises:
a plurality of inverters coupled in series as a chain structure between an input terminal and an output terminal;
a pull-up driving element coupled to a part of terminals of the plurality of inverters, and configured to selectively supply a supply voltage according to a pull-up control signal; and
a pull-down driving element coupled to the other part of the terminals of the plurality of inverters, and configured to selectively supply a ground voltage according to a pull-down control signal.

20. A duty correction device comprising:
a duty controller configured to output a control signal by controlling a duty of a duty corrected signal, and detect a level of a feedback signal to convert the duty based on a code signal; and
a power gating circuit configured to generate the feedback signal by driving the control signal,
wherein the duty controller forms a feedback loop through the duty controller and the power gating circuit to correct a duty of the power gating circuit,
wherein the duty controller comprises:
a level detection circuit configured to detect a logic level of the feedback signal based on an oscillation signal, and output a detection signal;
a comparison circuit configured to compare the detection signal and a previously stored signal, and output a comparison signal; and
a code generation circuit configured to generate the code signal based on the oscillation signal, and set the code signal based on the comparison signal.

* * * * *